United States Patent
Bandyopadhyay et al.

(10) Patent No.: US 11,757,466 B2
(45) Date of Patent: Sep. 12, 2023

(54) SYSTEM AND METHOD FOR DYNAMIC ELEMENT MATCHING FOR DELTA SIGMA CONVERTERS

(71) Applicant: Analog Devices, Inc., Wilmington, MA (US)

(72) Inventors: Abhishek Bandyopadhyay, Winchester, MA (US); Preston S. Birdsong, Medfield, MA (US); Adam R. Spirer, Westwood, MA (US)

(73) Assignee: Analog Devices, Inc., Wilmington, MA (US)

(*) Notice: Subject to any disclaimer, the term of this patent is extended or adjusted under 35 U.S.C. 154(b) by 40 days.

(21) Appl. No.: 17/395,902

(22) Filed: Aug. 6, 2021

(65) Prior Publication Data

US 2022/0045693 A1 Feb. 10, 2022

Related U.S. Application Data

(60) Provisional application No. 63/063,503, filed on Aug. 10, 2020.

(51) Int. Cl.
| | |
|---|---|
| *H03M 1/66* | (2006.01) |
| *H03M 3/00* | (2006.01) |
| *H04L 25/03* | (2006.01) |
| *H04L 25/49* | (2006.01) |
| *H03M 1/74* | (2006.01) |

(52) U.S. Cl.
CPC .............. *H03M 3/50* (2013.01); *H03M 1/66* (2013.01); *H03M 3/39* (2013.01); *H04L 25/03006* (2013.01); *H04L 25/4917* (2013.01); *H03M 1/747* (2013.01); *H04L 2025/03363* (2013.01)

(58) Field of Classification Search
CPC ............ H03M 3/50; H03M 1/66; H03M 3/39; H03M 1/747; H03M 1/742; H03M 1/0665; H04L 25/03006; H04L 25/4917; H04L 2025/03363
USPC ........................................................ 341/144
See application file for complete search history.

(56) References Cited

U.S. PATENT DOCUMENTS

| | | |
|---|---|---|
| 6,522,277 B2 | 2/2003 | Fujimori et al. |
| 7,079,063 B1 | 7/2006 | Nguyen et al. |
| 7,777,658 B2 | 8/2010 | Nguyen et al. |

(Continued)

FOREIGN PATENT DOCUMENTS

WO   WO-2022035718 A1   2/2022

OTHER PUBLICATIONS

"International Application Serial No. PCT/US2021/045130, International Search Report dated Nov. 23, 2021", 4 pgs.

(Continued)

*Primary Examiner* — Jean B Jeanglaude
(74) *Attorney, Agent, or Firm* — Schwegman Lundberg & Woessner, P.A.

(57) ABSTRACT

Systems and methods for improving the efficiency of a rotational dynamic element matching (DEM) for Delta Sigma converters. In some implementations, the systems and methods are provided for reducing intersymbol interference (ISI) of a Delta Sigma converter. A delta sigma converter architecture can include multiple I-DACs, and the output from each I-DAC can vary from the other I-DACs. Techniques include decreasing mismatch among multiple I-DACs while improving efficiency of rotational dynamic element matching.

20 Claims, 12 Drawing Sheets

(56) References Cited

U.S. PATENT DOCUMENTS

| | | |
|---|---|---|
| 8,847,807 B2 | 9/2014 | Bandyopadhyay et al. |
| 9,484,947 B1 * | 11/2016 | Nguyen ............... H03M 1/002 |
| 9,705,521 B1 | 7/2017 | Monk et al. |
| 10,693,489 B2 | 6/2020 | Roh et al. |
| 2003/0201922 A1 * | 10/2003 | Dagher ............... H03M 1/0665 |
| | | 341/143 |
| 2010/0052960 A1 | 3/2010 | Lakdawala et al. |
| 2010/0149012 A1 * | 6/2010 | Nguyen ............. H03M 1/0663 |
| | | 341/143 |

OTHER PUBLICATIONS

"International Application Serial No. PCT/US2021/045130, Written Opinion dated Nov. 23, 2021", 9 pgs.

* cited by examiner

| Magnitude | with DAR | and | without DAR |
|---|---|---|---|
| +2 | 0110,0000 | | 0110,0000 |
| +4 | 0111,1000 (+2) | | 0001,1110(+6) |
| +3 | 0001,1100(+3) | | 1100,0001(+7) |

FIG. 6

SYSTEM AND METHOD FOR DYNAMIC ELEMENT MATCHING FOR DELTA SIGMA CONVERTERS

CROSS-REFERENCE TO RELATED APPLICATIONS

This application is related to and claims the benefit of priority under 35 U.S.C. § 119(e) to U.S. Provisional Patent Application No. 63/063,503 entitled, "SYSTEM AND METHOD FOR DYNAMIC ELEMENT MATCHING FOR DELTA SIGMA CONVERTERS" filed on Aug. 10, 2020, which is hereby incorporated by reference in its entirety.

FIELD OF THE DISCLOSURE

The present invention relates to converters, and more specifically, to delta sigma converters.

BACKGROUND

Sigma-delta digital-to-analog converters (DACs) are widely used for high resolution and low distortion digital to analog signal conversions. In general, sigma-delta DACs are cost effective compared to traditional Nyquist converters. In a typical multi-bit noise-shaped oversampling DAC system, a digital input may be first up-sampled by an up-sampler at an oversampling ratio (OSR), e.g., from a signal of 24-bit word width at 48 kHz to the same word width at 128×48 kHz. The up-sampled signal may then be filtered at to suppress out-of-band images. A sigma-delta modulator may follow the filter to reduce the word width, e.g., from 24 bit wide to N bit, where N<24. The sigma-delta modulator may also shape the in-band noise to a higher frequency region. Then a binary to thermometer encoder may convert the binary data of, e.g., N bits, into thermometer-code data of, e.g., $2^N$ levels for converting binary codes into an analog signal.

However, a multi-bit (i.e., for N>2) DAC may cause unwanted linear errors in the analog signal output as discussed in U.S. Pat. No. 5,404,142 (the '142 patent). One technique to reduce the linear errors in the analog output may be to use a shuffler (or scrambler) to shuffle the thermometer-code data. For example, the '142 patent discloses a data-directed scrambling technique in which a quantized noise-shaped word is first converted to a thermometer code. A data-directed shuffler is then used to dynamically select a group of elements at the output stage. The number of elements selected may equal to the number of active thermometer codes. Finally, a thermometer-code DAC may convert the output of the shuffler into an analog quantity by activating the selected group of elements.

A thermometer-code DAC may include a current steering section and an I-to-V converter that includes a DAC cell driver that controls the BIT and BIT (or BITB) signals. By designing the cross point of the BIT and BITB signals to be one $V_{gs}$ above the common-mode voltage, the inter-symbol interference (ISI) in the DAC cell output waveform may be minimized. $V_{gs}$ is defined to be the gate-to-source voltage of the DAC switches when each is conducting half of the output current.

Due to device imperfection in practice, current cells may not match exactly. This mismatch problem may result in harmonic distortion and noise in the reconstructed analog signal. The performance of the converter is thus limited by the mismatching of these elements. For this reason, commercially available silicon processes may only offer matching of up to 12 bits without calibration or trimming.

This element mismatch has been studied, and methods have been proposed to shape the mismatch error into spectrally shaped noise. For example, shaping the mismatch error into out-of-band frequency region may greatly improve the signal-to-noise ratio (SNR) and dynamic range (DNR) of a converter. One type of solution may use a shuffler (or scrambler) to dynamically select a group of elements for each digital input code such that over time, each element is equally used. This implies that the first integral of the difference between every pair of elements is close to zero, hence, equivalent to a first-order noise shaped sigma-delta converters. The only difference is in a normal sigma-delta converter, the amplitude error is noise shaped whereas in a data shuffler, the error in the usage of the element is noise shaped, U.S. Pat. No. 6,614,377 shows an example butterfly style shuffler.

One drawback of conventional thermometer-code current steering DACs is thermal noise performance. In particular, when data is zero, half of the switching current sources may be connected to one summing junction, and the other half may be connected to the other summing junction of the I-to-V converter. Moreover, the top current sources may be always connected to the summing junctions. The current sources are the dominant thermal noise source in the DAC output and dictate the SNR of the converter.

One technique to overcome the above-discussed thermal noise problem uses three-level logic thermometer current steering DAC that includes a pair of current sources (positive and negative) for, e.g., each of bits 0-7. Since each pair of current sources may be connected to the summing junction in three different ways, each pair may contribute a positive quantity of charge, a negative quantity of charge, or nothing at all. When the data is zero, all the current sources are connected to a buffer amplifier to maintain their proper drain voltage. Thereby, the main noise source is from the amplifier, which by design is much smaller than that of the current sources. Hence, the SNR may be significant y improved.

For the three-level logic thermometer current steering DAC, U.S. Pat. No. 7,079,063 (the '063 patent), proposed a dynamic element matching technique that works with three-level elements. The technique uses a signed thermometer encoder, two barrel shifters, and a main data shuffler. The main data shuffler may function to shape mismatch errors into higher frequency region for preserving the base band SNR. Each output of the data shuffler may be a three-level signal which has a spectrum of the input base band and a first-order high-pass shaped noise. It follows that the difference between any pair of elements of the output may also be first-order high-passed. This implies that any mismatch error between the two elements may also be shaped.

The main shuffler may include a network of shuffler cells inter-connected in a butterfly configuration. Each shuffler cell may perform a first-order noise shaping function on the error introduced by the pair of elements controlled by the outputs of the cell. Since these first order modulators may produce idle tones that degrade the SNR and the total harmonic distortion (THD+N) performance of the converter, the '063 patent used two barge shifters controlled by a pseudo-random number generator to break up any periodic behavior in the input streams of the main data shuffler to eliminate the idle tone problem.

SUMMARY OF THE DISCLOSURE

Systems and methods are provided for improving the efficiency of a rotational dynamic element matching (DEM)

for Delta Sigma converters. In some implementations, the systems and methods are provided a for reducing intersymbol interference (ISI) of a Delta Sigma converter. A delta sigma converter architecture can include multiple I-DACs, and the output from each I-DAC can vary from the other I-DACs. Techniques are disclosed for decreasing mismatch among multiple I-DACs while improving efficiency of rotational dynamic element matching.

According to one aspect, a system for rotational dynamic element matching in a delta sigma converter is provided, comprising a rotational dynamic element matching (DEM) component configured to receive a data signal, wherein the rotational DEM component has a plurality of elements, a start pointer, and a current pointer, wherein the current pointer shifts in a first direction when the data signal is positive and wherein the current pointer shifts in an opposite direction when the data signal is negative.

According to some implementations, the rotational DEM component is a barrel shifter, and wherein the current pointer shifts circularly. In some implementations, the first direction is clockwise and the opposite direction is counterclockwise. In some implementations, the system includes a current digital to analog converter configured to convert a rotational DEM component output into an analog signal. In some implementations, the current digital to analog converter is one of a 2-level current digital to analog converter and a 3-level current digital to analog converter. In some implementations, the data signal includes a sign indicator, wherein the sign indicator indicates whether the data signal is positive or negative.

According to some implementations, the current pointer is a first current pointer and further comprising a second current pointer wherein the first current pointer points at a first element from the plurality of elements and the second current pointer points at a second element from the plurality of elements and the first element is higher than the second element, and wherein when the data signal is positive, the second current pointer is shifted up and when the data signal is negative, the first current pointer is shifted down.

According to another aspect, a system for converting digital signals into analog signals using sigma-delta modulation is provided, comprising a rotational dynamic element matching (DEM) component configured to receive a data signal, wherein the rotational DEM component has a plurality of elements, a start pointer, and a current pointer; and a current digital-to-analog converter configured to convert a rotational DEM component output into an analog signal.

According to some implementations, the current pointer shifts in a first direction when the data signal is positive and wherein the current pointer shifts in an opposite direction when the data signal is negative. In some implementations, the current DAC is one of a 2-level current DAC and a 3-level current DAC. In some implementations, the current DAC is one of a continuous time DAC and a discrete time DAC. In some implementations, the rotational DEM component is configured to randomly reseat the start pointer and the current pointer. In some implementations, the rotational dynamic element matching module includes three pointers.

BRIEF DESCRIPTION OF THE DRAWINGS

The present disclosure is best understood from the following detailed description when read with the accompanying figures. It is emphasized that, in accordance with the standard practice in the industry, various features are not necessarily drawn to scale, and are used for illustration purposes only. Where a scale is shown, explicitly or implicitly, it provides only one illustrative example. In other embodiments, the dimensions of the various features may be arbitrarily increased or reduced for clarity of discussion.

For a fuller understanding of the nature and advantages of the present invention, reference is made to the following detailed description of preferred embodiments and in connection with the accompanying drawings, in which:

FIG. 6 shows an example of the reduction in transitions using the original rotation mode and the rotation mode with DAR;

DETAILED DESCRIPTION

Systems and methods are provided for improving the efficiency of a rotational dynamic element matching (DEM) for Delta Sigma converters. In some implementations, the systems and methods are provided for reducing intersymbol interference (ISI) of a Delta Sigma converter. A delta sigma converter architecture can include multiple I-DACs, and the output from each I-DAC can vary from the other I-DACs. Techniques are disclosed for decreasing mismatch among multiple I-DACs while improving efficiency of rotational dynamic element matching.

Figure 1:
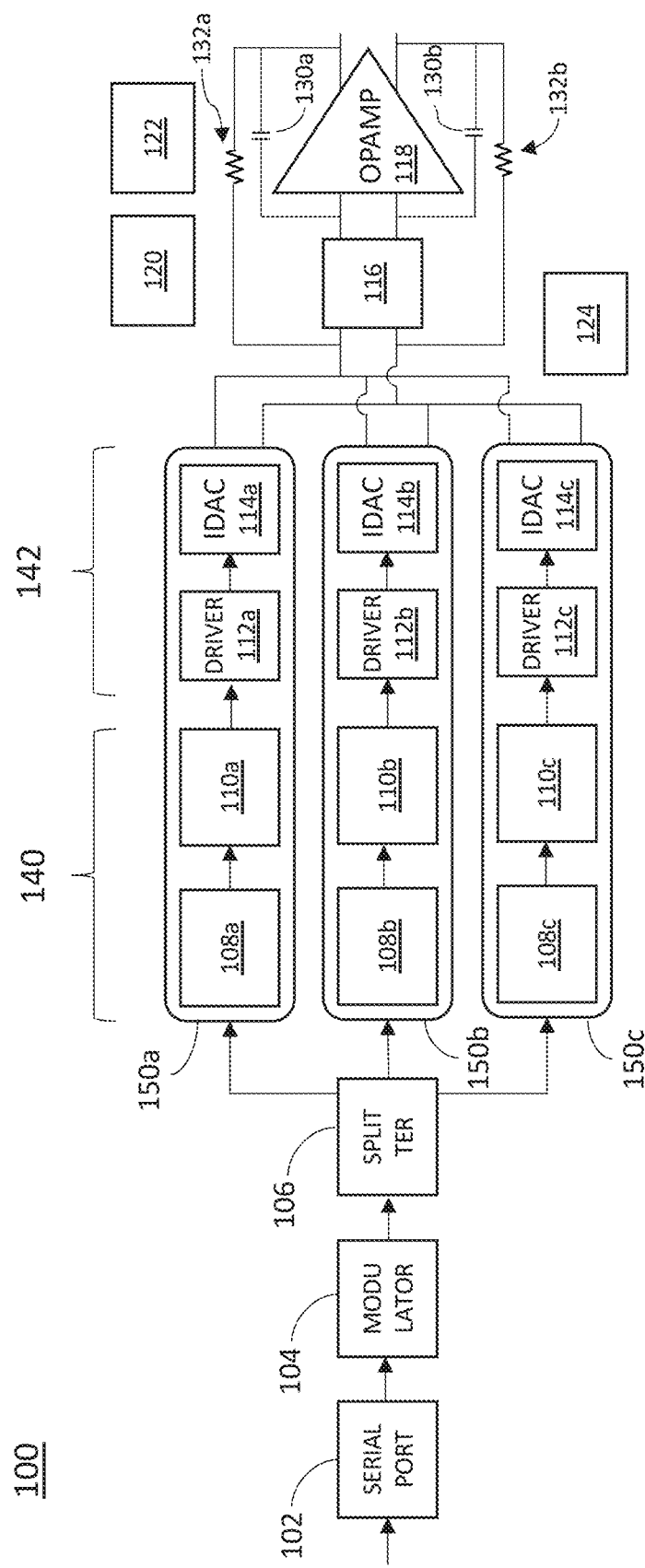
FIG. 1 depicts a system architecture for a digital to analog converter (DAC) playback path, according to various embodiments of the disclosure.

FIG. 1 depicts a system architecture for a continuous time (CT) digital to analog converter (DAC) playback path, according to various embodiments of the disclosure. The audio playback path 100 includes a serial port and interpolator 102, a modulator 104, and a noise-shaping splitter 106. A digital input signal is input to the serial port and interpolator 102. In various examples, the input signal includes multiple samples and bus widths. In one example, the input signal includes 24 bit input. The input signal is interpolated and input to the modulator 104. In some examples, the interpolation filter uses canonical signed digit arithmetic, and thus has low power consumption. In some examples, the modulator 104 is a second order modulator. In some examples, the modulator 104 is an eight bit modulator. The modulator output is input to the noise-shaping splitter 106. The noise shaping splitter 106 splits the signal into three parallel processing lines, and outputs a first sample set to a first line 150a, a second sample set to a second line 150b, and a third sample set to a third line 150c. In some examples, the noise shaping splitter 106 splits the signal into the three sample sets, and each of the first, second, and third sample sets has a different gain. In one example, the first sample set has a gain of 1×, the second sample set has a gain of 4×, and the third sample set has a gain of 16×. Splitting the signal at the noise shaping splitter reduces the number of elements and the overall area of the CT DAC playback path.

Each of the first 150a, second 150b, and third 150c parallel processing lines includes a sign-magnitude conversion element 108a, 108b, 108c, a rotational scrambler 110a, 110b, 110c, an I-DAC driver 112a, 112b, 112c, and an I-DAC 114a, 113b, 114c. In some examples, the I-DACs 114a, 113b, 114c are 2-level I-DACs, and in some examples, the I-DACs 114a, 113b, 114c are 3-level DACs. Note that the signal is a digital signal through to the rotational scrambler (section 140), which outputs a digital signal to the I-DAC driver 112a, 112b, 112c. According to various implementations, the audio playback path 100 depicts a 1st-order noise shaped segmentation technique. In some examples, the sign-magnitude conversion elements 108a, 108b, 108c perform sign magnitude thermometer code conversion. Following the conversion elements 108a, 108b, 108c, the one or more of the scramblers 110a, 110b, 110c apply individual discrete element modeling (DEM) to the signals in one or more of the respective parallel processing lines 150a, 150b, 150c. In various implementations, the DEM is rotational in nature. In some examples, the DEM is first order DEM, and in some examples, the DEM is higher order DEM such as second order DEM, third order DEM, or higher. In some examples, the CT DAC of FIG. 1 is part of an audio playback path including headphone and/or speaker drivers.

The outputs from the first 150a, second 150b, and third 150c parallel processing lines are input to ISI free switching element 116. The outputs are also connected to parallel resistors 132a, 132b connected to the playback line 100 output. The switching element 116 output is input to an operational amplifier 118. On the right, the operational amplifier 118 and the resistors 132a, 132b dominate the noise contributions following the first 150a, second 150b, and third 150c parallel lines. The audio playback path 100 also includes an I-DAC bias generator 120, a bandgap element 122, and an ISI free clock generation 124. According to various implementations, the playback path 100 includes one or more elements described herein. The operational amplifier 118 and resistors 132a and 132b constitute a current to voltage converter which translate the overall current (provided by the current cells in the IDACs 214a, 213b, 241c) to an output voltage. In some examples, the operational amplifier 118 is a class AB operational amplifier. In some examples, the operational amplifier 118 is a class D operational amplifier.

According to various implementations, the system shown in FIG. 1 includes a $1^{st}$-order noise shaped segmentation technique. In some examples, after a sign magnitude thermometer code conversion, individual rotational DEM is applied to each of the segmented data at the rotational scramblers 110a, 110b, 110c. The rotational DEM takes a mismatch for each of the current cells and does some shaping on it. Systems and methods are provided herein for improving the noise shaping splitter.

The rotational DEM 110a, 110b, 110c takes a mismatch for each of the current cells and does some shaping on it. According to various implementations, the systems and methods provided herein help with the mismatch between the various I-DACs. Additionally, the systems and methods provided herein solve the problem of intersymbol interference. In general, intersymbol interference is a memory effect caused when there are several zeros or ones in a row (as opposed to more of an alternating pattern of 1s and 0s), because of errors at the edges of blocks of the same number.

The rotational DEM (or rotational scrambler) 110a, 110b, 110c removes errors that occur in the I-DACs. In some examples, the rotational DEM 110a, 110b, 110c performs pre-distortion, removing downstream effects. In some examples, the rotational DEM 110a, 110b, 110c acts as a pre-filter.

Figure 2:
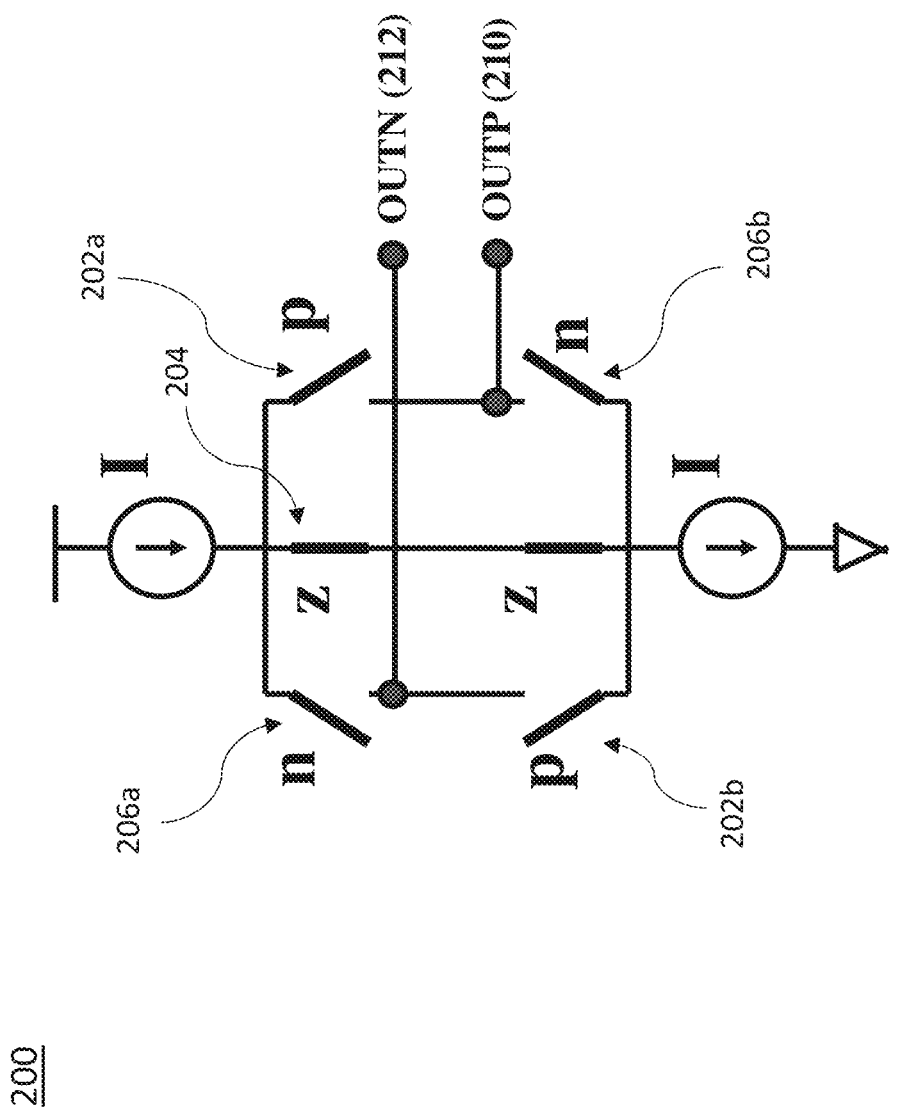
FIG. 2 shows a 3-level I-DAC 200 including several switches, according to various embodiments of the disclosure.

FIG. 2 shows a 3-level I-DAC 200 including several switches. When a positive signal is received, the p-switches 202a, 202b are closed, allowing current to flow to the outP output 210. When a negative signal is received, the n-switches 206a, 206b are closed, allowing current to flow to the outN output 212. Additionally, in the 3-level I-DAC 200 shown in FIG. 2, when the input is zero, current is shunted through the I-DAC 200 via the center line 204. When the current is shunted through the I-DAC 200, the current does not go to the outP output 210 or the outN output 212, and thus does not contribute to noise. In particular, elements are not connected to active circuitry in the I-DAC 200 during a zero state.

According to various examples, the 3-level I-DAC has low thermal noise, is low power, and it is intersymbol interference immune. A low powered DEM can be used with the 3-level I-DAC 200. In some examples, a 3-level rotational DEM can be used with the 3-level I-DAC 200.

In some examples, a 3-level rotational DEM includes logic to determine the start of the group of elements to be used as output. Pointers keep track of the start of the group of elements for positive and negative data. In some examples, a 1-barrel shifter can be used for both positive and negative data.

According to various implementations, mismatch shaping can be used for a rotational DEM. In particular:

$$e_i = u_i - \frac{1}{N}\sum_{k=1}^{N} u_k$$

where, $u_i$=actual value of an element, $e_i$=error contributed by the element, and N=number of DAC elements. Thus, the mismatch error for a particular element i equals the actual value of the element i minus the average of the actual values for all the elements. In particular, when the data equals +1, and the element i is selected (having a value $u_i$), the error equals $e_i$. When the data equals −1, and the element i is selected (having a value $u_i$), the error equals −$e_i$. When the data equals 0, and the element i is selected (having a value $u_i$), the error equals 0. Thus, any error contributed by an element i can be undone by using the same element i in the opposite sense. That is, a positive error (+$e_i$) for the element i can be cancelled out by using the same element i in the opposite direction, resulting in a negative error (−$e_i$), since ($e_i$−$e_i$=0). This is described in greater detail below with respect to FIGS. 3, and 4A-4C.

Figure 3:
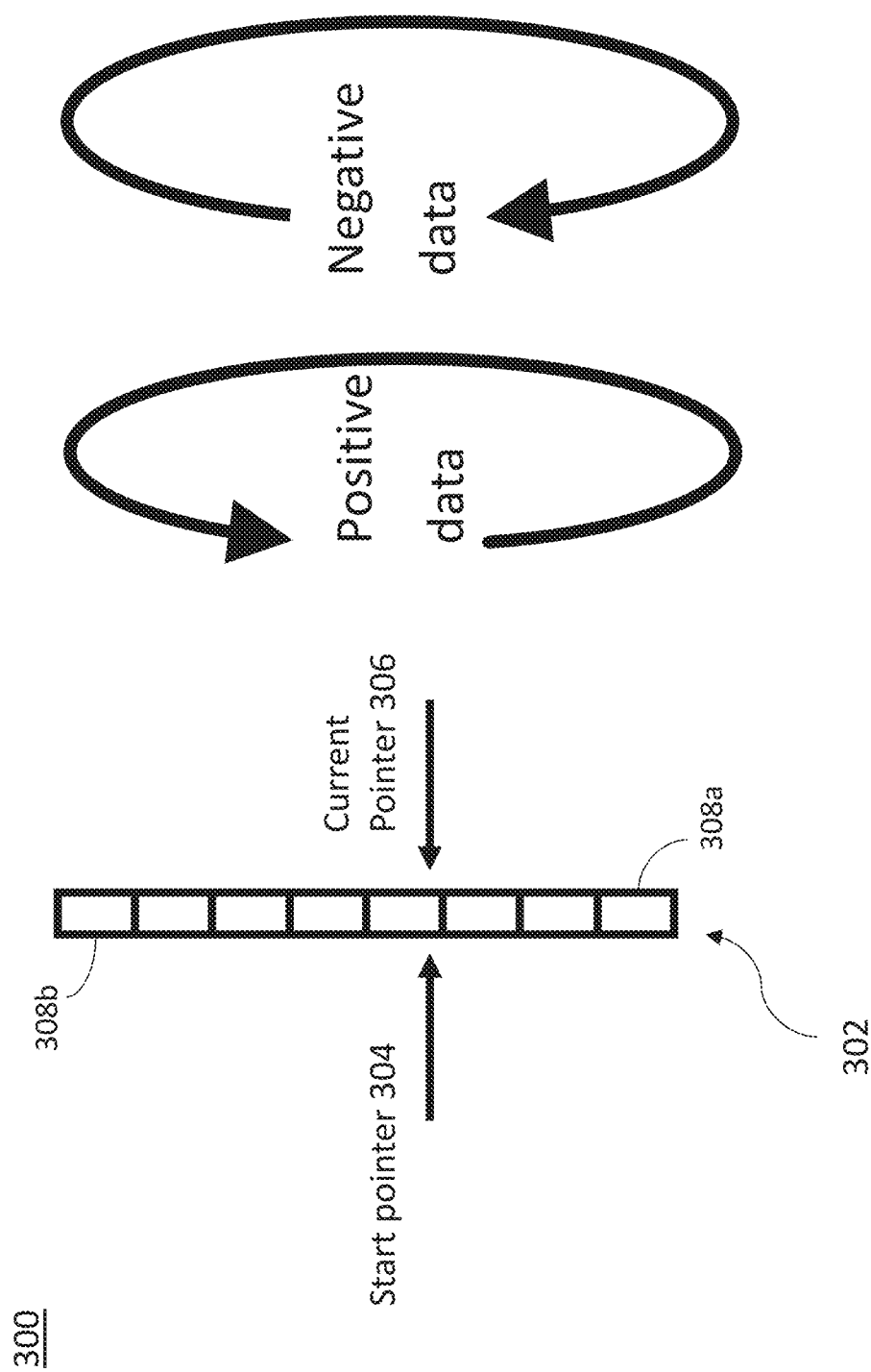
FIG. 3 is a diagram 300 showing an eight element 3-level rotational DEM 302, according to various embodiments of the disclosure.

FIG. 3 is a diagram 300 showing an eight element 3-level rotational DEM 302, according to various embodiments of the disclosure. As shown in the diagram 300, the rotational DEM includes a start pointer 304 and a current pointer 306. The current pointer 306 indicates the first element to be used for the next data cycle for positive data. For negative data in the next data cycle, the current point 306 moves backwards/down (current point −1), to point at the next element to be used in the next data cycle for negative data.

In some implementations, the current pointer 306 revolves in the counter-clockwise direction for positive data and in a clockwise direction for negative data. The current pointer advances and wraps around. Thus, for positive data, when the current pointer 306 reaches the last/top element 308b of the rotational DEM 302, the current pointer 306 moves back to the first/bottom element 308a of the DEM 302. Similarly, for negative data, when the current pointer 306 reaches the first/bottom element 308a of the rotational DEM 302, the current pointer 306 moves back to the last/top element 308b of the DEM 302. The start pointer 304 indicates the last time the start pointer 304 and the current pointer 306 were pointing to the same element. In other implementations, the current pointer 306 revolves in the clockwise direction for positive data and in a counter-clockwise direction for negative data.

Figure 4A:
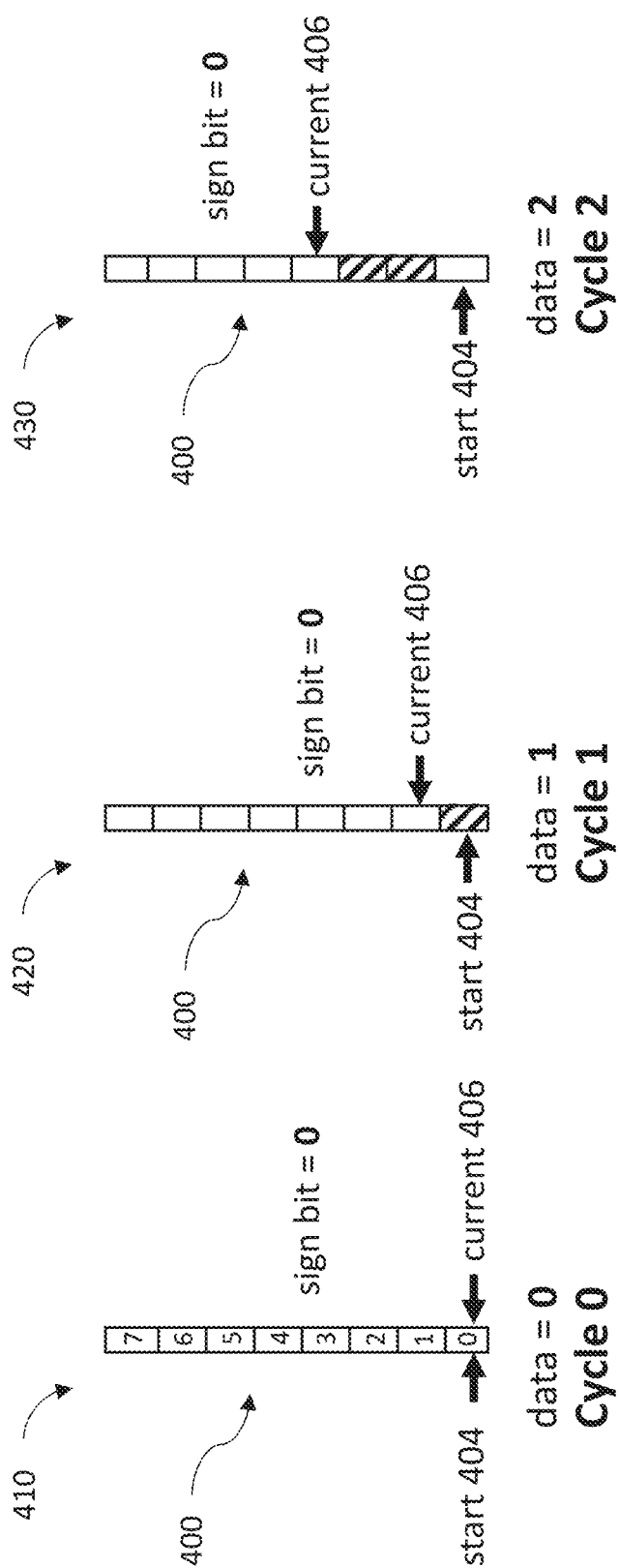
FIGS. 4A-4C illustrate exemplary operations of an eight element three level rotational DEM, according to various embodiments of the disclosure.
Figure 4B:
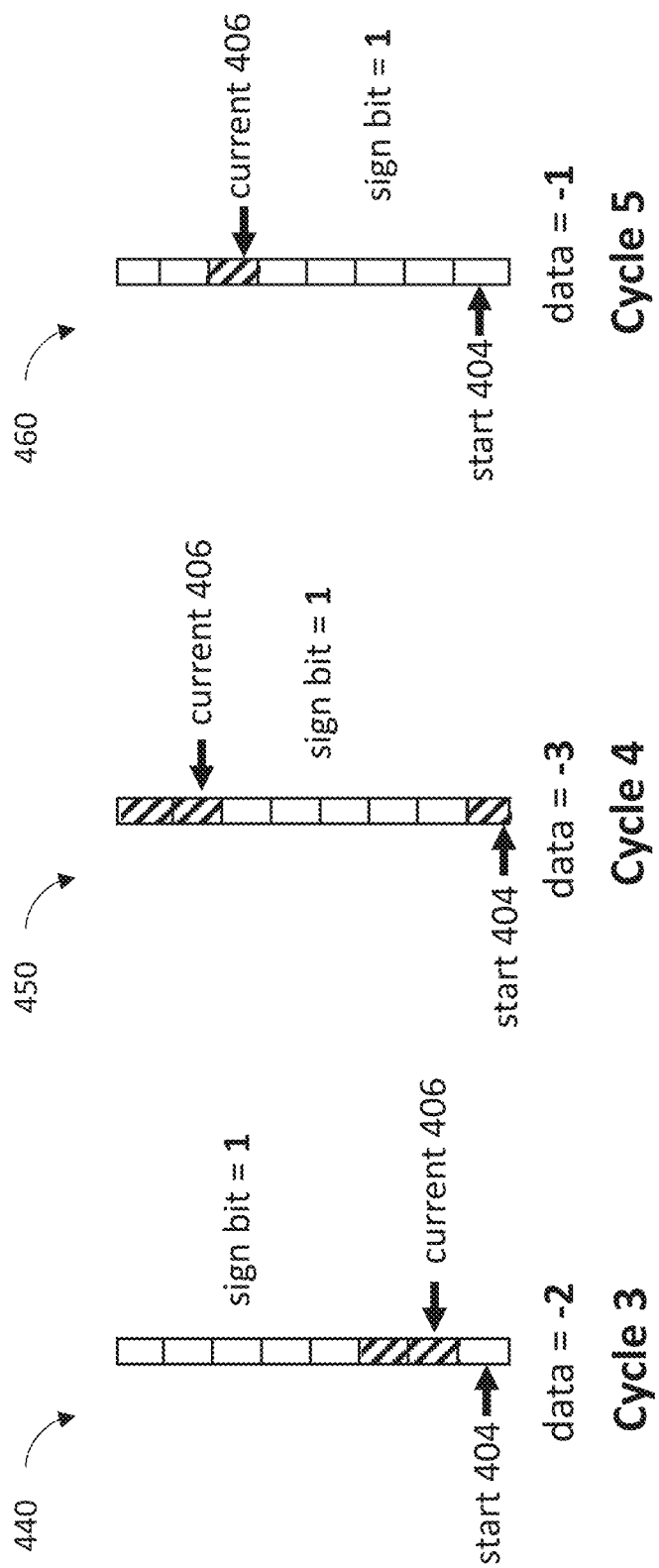
Figure 4C:
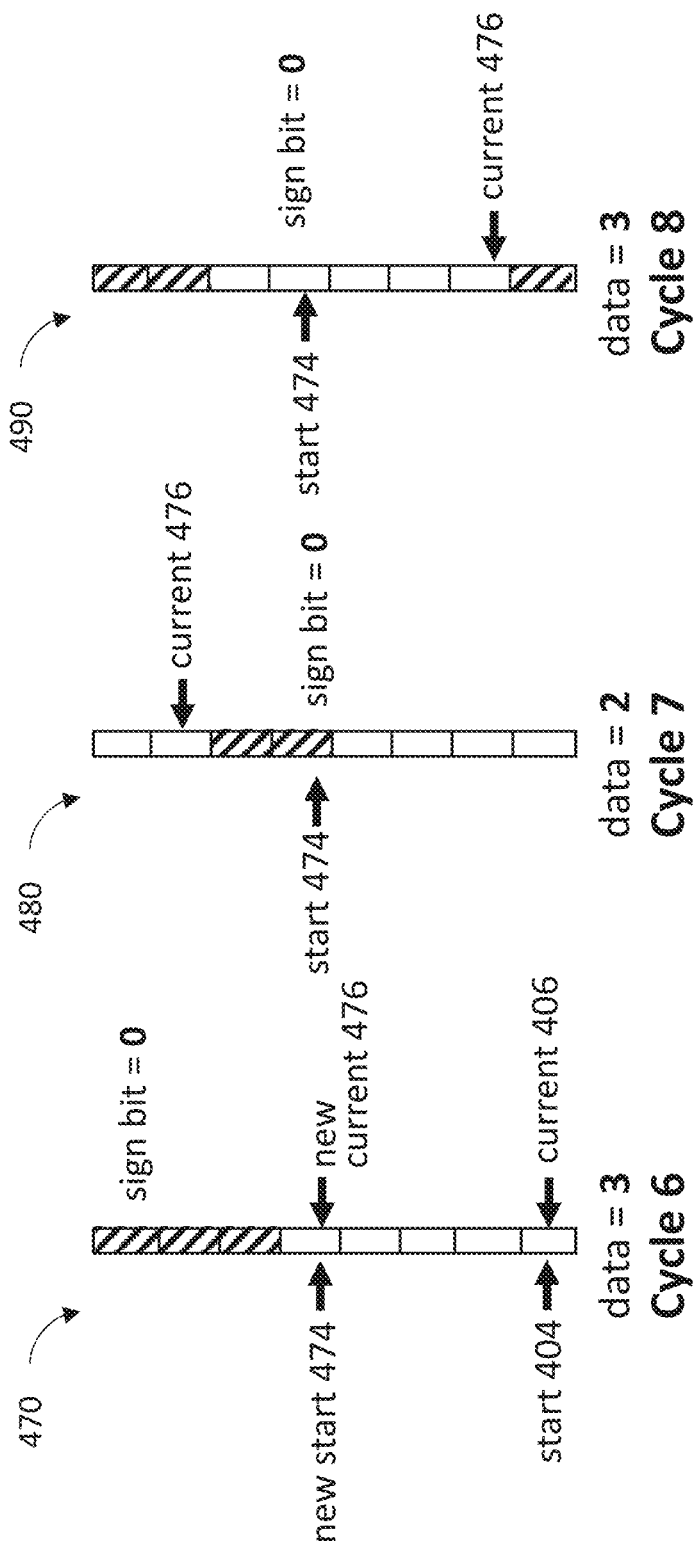

FIGS. 4A-4C illustrate exemplary operations 410, 420, 430, 440, 450, 460, 470, 480, 490 of an eight element three level rotational DEM 400, according to various embodiments of the disclosure. In particular, FIGS. 4A-4C show an eight element rotational barrel shifter. In the first example 410, each element of the rotational DEM 400 is labeled with an element number (element 0, element 1, element 2, element 3, element 4, element 5, element 6, element 7). The corresponding elements in the other examples are also referred to by these numbers. The rotational DEM 400 has a start pointer 404 and a current pointer 406. The current pointer 406 moves depending on the data. Starting at the start pointer 404, the current pointer 406 points to where the next cycle begins. The current pointer 406 moves in one direction (e.g., counterclockwise) for positive data and the current pointer 406 moves in the other direction (e.g., clockwise) for negative data. Although FIGS. 4A-4C show the pointers pointing to a vertical line, the shifter is circular and wraps around.

According to various implementations, the three level rotational DEM 400 follows a number of rules. For example, the three level rotational DEM 400 keeps track of the sign of errors being made, as indicated by the "sign bit" for each element. Additionally, the three level rotational DEM keeps track of the DEM elements being used, and uses the eight elements equally. While some elements can be skewed, the error is spread out. The direction and amount of rotation of the three level rotational DEM 400 depends on the data type. A positive error associated with an element is undone by using it in the negative sense as soon as possible, and vice versa, as described in greater detail below. The undoing of the error is enabled by bi-directional rotation.

In various implementations, the technique used for the three level rotational DEM 400 is a last in first out (LIFO) technique. In particular, the element that was last used for a positive data will be the first one to be used for a negative data, and vice versa. This is different from existing techniques, in which a first in first out (FIFO) technique is used. In existing techniques, the pointers for positive and negative data followed each other by unidirectional rotation of both pointers.

As shown in FIG. 4A, the first example 410 is cycle 0, and both the start 404 and the current 406 pointers point to element 0. Incoming data is equal to zero, so the start 404 and current 406 pointers do not move. Then, at cycle 1 (example 420), a first data is received. The first data is positive so the sign bit is equal to zero. The first data is +1, so it uses one element, element 0, and the current pointer 406 moves up (counterclockwise) to the second element. At cycle 2, (example 430), a second data is received. The second data is positive so the sign bit is equal to zero. The second data is a +2 data signal, and the current pointer 406 moves up two elements (counterclockwise) to element 3.

FIG. 4B shows the next three cycles. At cycle 3 (example 440), a third data is received. The third data is negative, so the sign bit is equal to one. The third data is a −2 data signal, and the current pointer 406 moves down (clockwise) two elements, so it is pointing to element 1 again. At cycle 4 (example 450), a fourth data is received. The fourth data is negative, so the sign bit is equal to one. The fourth data is a −3 data signal, and the current pointer 406 moves down (clockwise) three elements. After element 0, the current pointer 406 wraps around to element 7, so moving down three elements from element 1, the current pointer 406 is pointing to element 6. At cycle 5 (example 460), a fifth data is received. The fifth data is negative, so the sign bit is equal to one. The fifth data is a −1 data signal, and the current pointer 406 moves down (clockwise) one element to element 5.

FIG. 4C shows the next three cycles. At cycle 6 (example 470), a sixth data is received. The sixth data is positive, so the sign bit is equal to zero. The sixth data is a +3 data signal, and the current pointer 406 moves up three elements, so it is pointing at element 0 again. When the current pointer 406 is back in the same position as the start pointer 404, the elements of the rotational DEM 400 have all been used equally. In particular, both positive and negative elements have been used equally. When all of the elements of the rotational DEM 400 have been used equally, the total mismatch error is zero. Thus, any error by an element i has been undone by using the same element i in the opposite sense. That is, any positive error (+$e_i$) for an element i has been cancelled out by using the same element i in the opposite direction, resulting in an equal negative error (−$e_i$), since ($e_i$−$e_i$=0).

When the current pointer 406 and start pointer 404 are equal, both the current pointer 406 and the start pointer 404 are reseated to a different element in the rotational DEM 400. In one example, the reseating is done randomly. In another example, the start 404 and current 406 pointers are jumped by a fixed value (e.g., +4, as shown in cycle 6). As shown in the example 470, the new start pointer 474 is set to element 4, and the new current pointer 476 is also set to element 4. Then, the DEM process continues.

At cycle 7 (example 480), a seventh data is received. The seventh data is positive, so the sign bit is equal to zero. The seventh data is a +2 data signal, and the current pointer 476 moves up (counterclockwise) two elements, so it is pointing at the sixth element. At cycle 8 (example 490), an eighth data is received. The eight data is positive, so the sign bit is equal to zero. The eight data is a +3 data signal, and the current pointer 476 moves up (counterclockwise) three elements, wrapping around back such that the current pointer 476 is pointing at element 1.

Figure 5A:
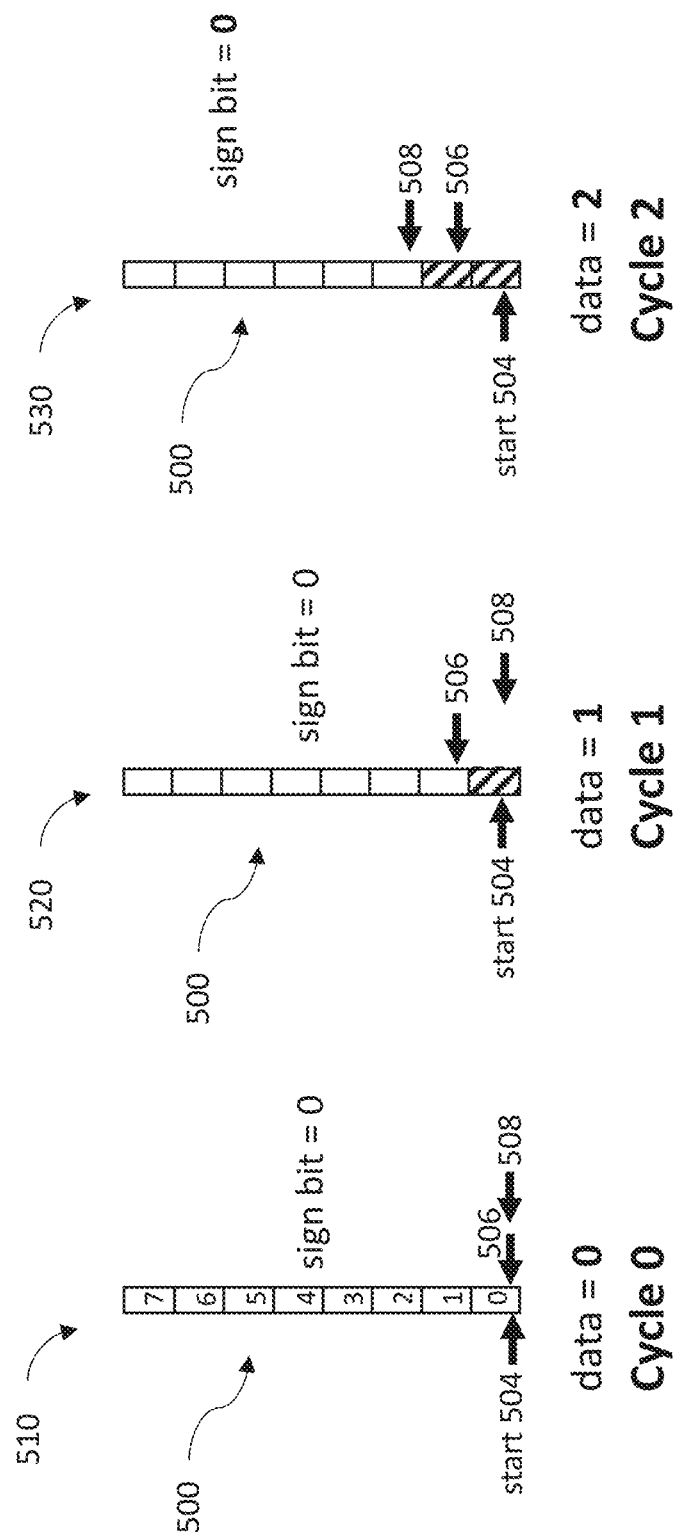
FIGS. 5A-5C illustrate exemplary operations of an eight element three level rotational DEM in a DAC activity reduction (DAR) mode, according to various embodiments of the disclosure.
Figure 5B:
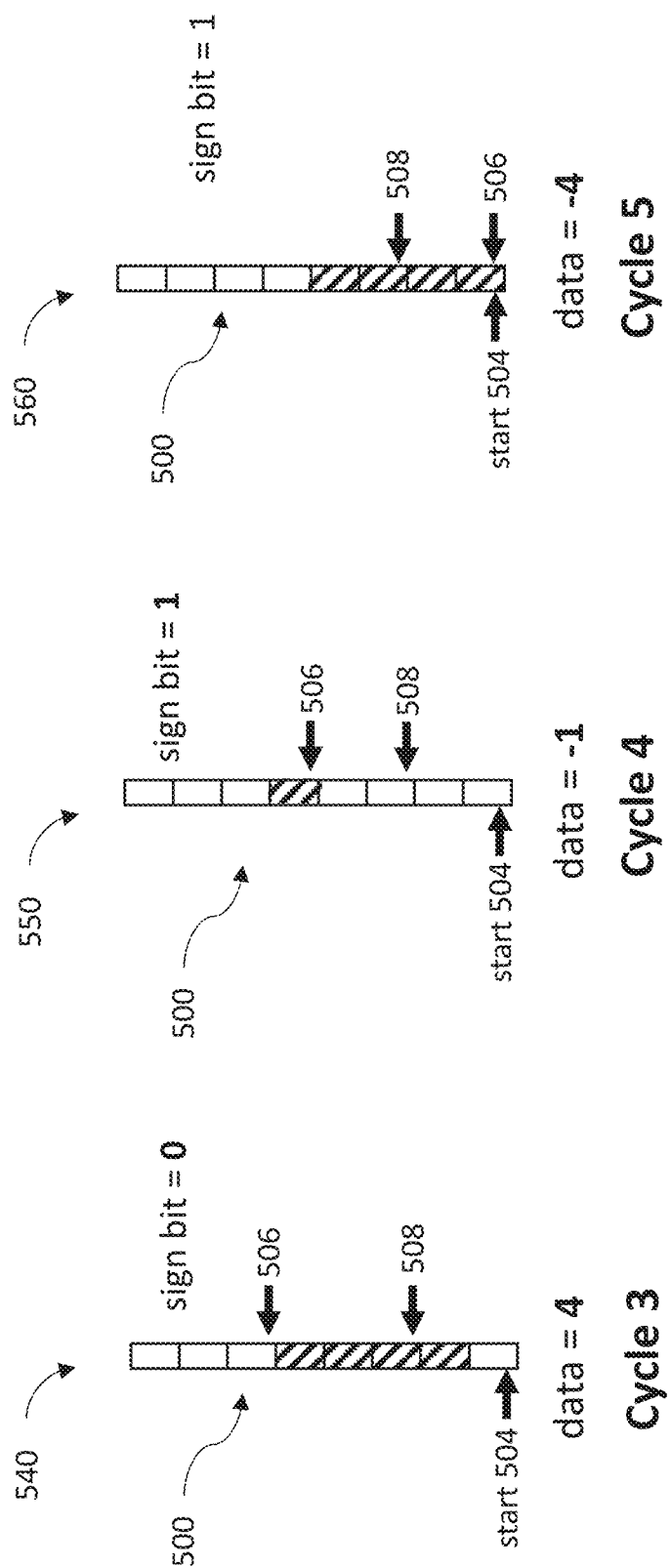
Figure 5C:
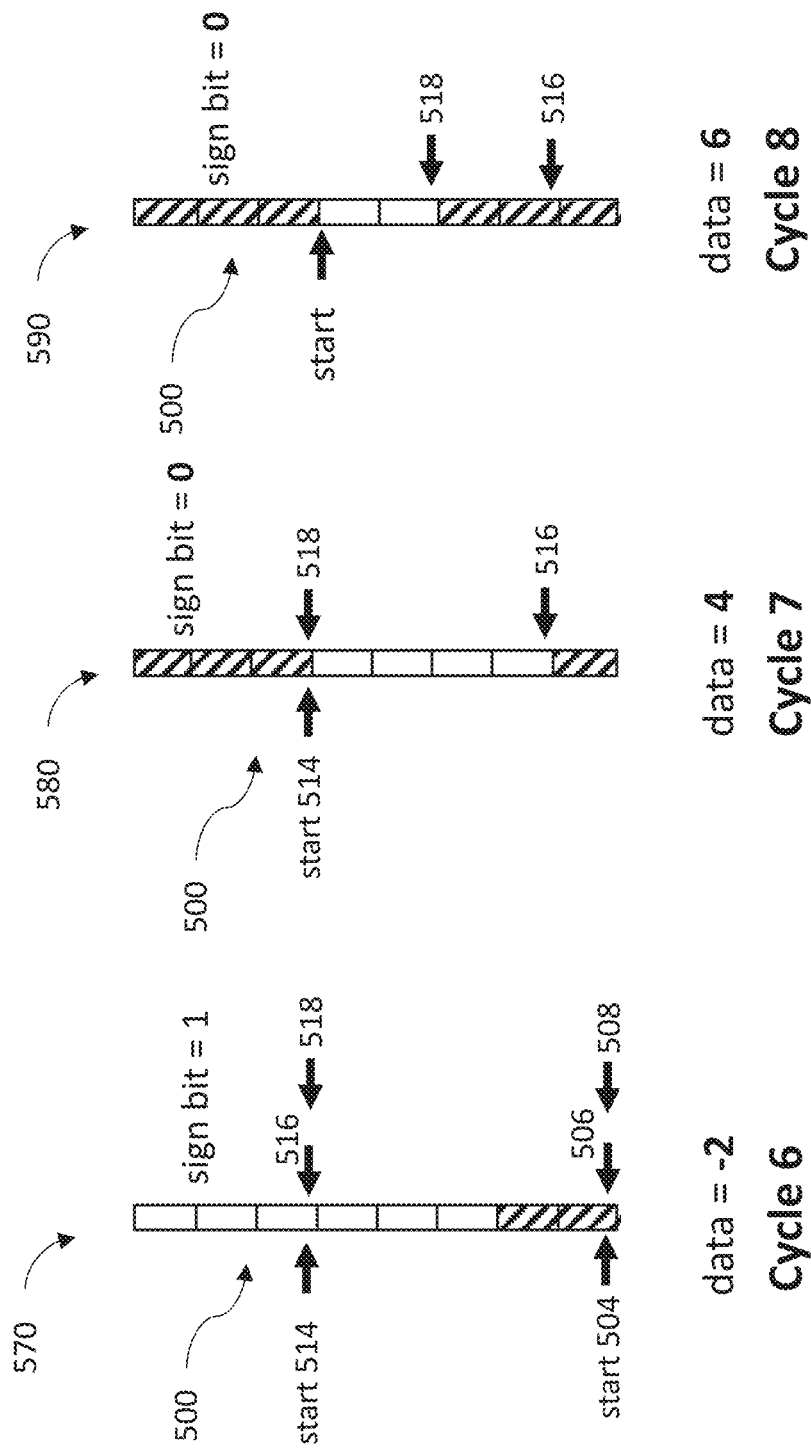

FIGS. 5A-5C illustrate exemplary operations 510, 520, 530, 540, 550, 560, 570, 580, 590 of an eight element three level rotational DEM 500 in a DAC activity reduction (DAR) mode, according to various embodiments of the disclosure. In a DAR mode, the rotational DEM 500 includes a start pointer 504, a first current pointer 506, and a second current pointer 508. Using the first 506 and second 508 pointers, the DAR mode includes logic that results in the DAC cells being selected up to two times in a row within a rotation. This significantly reduces the switching activity of DAC cells. Reducing switching activity of DAC cells is significant because each time a DAC cell is switched in or out of the signal path, charge injection occurs. Thus, using the DAC activity reduction mode, intersignal interference is reduced.

According to various implementations, in DAR mode, when positive data is received, the lowest pointer (of the first 506 and second 508 pointers) is selected. Similarly, when negative data is received, the highest pointer (of the first 506 and second 508 pointers) is selected. As shown in the examples of FIGS. 5A-5C, using the two current pointers according to DAR mode, the number of cell transitions is reduced.

FIGS. 5A-5C show an eight element rotational barrel shifter. In the first example 510, each element of the rotational DEM 500 is labeled with an element number (element 0, element 1, element 2, element 3, element 4, element 5, element 6, element 7). The corresponding elements in the other examples are also referred to by these numbers. The rotational DEM 500 has a start pointer 504 and a first 506 and second 508 current pointers. The first 506 and second 508 current pointers move depending on the data. Starting at the start pointer 504, when the first 506 and second 508 current pointers are pointing at the same element, when positive data is received, one of the first 506 and second 508 current pointers is selected and is moved up (counter-clockwise) by the number of elements corresponding to the incoming data. Starting at the start pointer 504, when the first 506 and second 508 current pointers are pointing at the same element, when negative data is received, one of the first 506 and second 508 current pointers is selected and is moved down (clockwise) by the number of elements corresponding to the incoming data. Once one of the current pointers 506 and 508 has moved away from the start pointer 504, when positive data is received, the lower of the current pointers 506 and 508 moves up for each data element. Similarly, once one of the current pointers 506 and 508 has moved away from the start pointer 504, when negative data is received, the higher of the current pointers 506 and 508 moves down for each data element.

In the example of FIG. 5A, at cycle 1, the data is a +1 data signal. The first current pointer 506 is selected and moved up one element to point at element 1, and the sign bit is set to zero. At cycle 2, the data equals +2. Since the incoming data is positive, the lower of the first 506 and second 508 current pointers is selected and moved up by two elements to point at element 2. The sign bit is set to zero. In this manner, element zero is reused in cycle 2.

FIG. 5B shows the next three cycles. At cycle 3, the data is a +4 signal. Since the first current pointer 506 is lower at cycle 2, at cycle 3, the first current pointer 506 is moved up four elements. At cycle 4, the received data is a −1 signal. Since the signal is negative, the higher current pointer is moved down. Thus, the first current pointer 506 is moved down one element. At cycle 5, the received data is a −4 signal. The higher current pointer is the first current pointer 506, so the first current pointer 506 is moved down to element 0.

FIG. 5C shows the next three cycles. At cycle 6, the data is a −2 signal. Since the signal is negative, the higher current pointer is moved down. Thus, the second current pointer 508 is moved down to element zero. At cycle 6, the first 506 and second 508 current pointers are both back at the same element as the start pointer 504, element 0. Thus, the positive and negative elements have been used an equal number of times, and the total error contributed to the system equals zero. According to various implementations, when the first 506 and second 508 current pointers and the start pointer 504 are all at the same element, the pointers are reseated. In the example shown in FIG. 5C, the pointers are reseated at cycle 6 to all point at element 5. In particular, the start pointer 504 is reseated to the new start pointer 514, the first current pointer 506 is reseated to the new first current pointer 516, and the second current pointer 508 is reseated to the new second current pointer 518.

At cycle 7, the received data is a +4 signal. The first current pointer 516 is moved up four elements, and wraps around to point at element 1. At cycle 8, the received data is a +6 signal. The second current point 518 is higher, so the second current pointer 518 is moved up six elements, and wraps around to point at element 4.

In FIGS. 5A-5C, the number of cell transitions reduced by 31% using DAC activity reduction mode as compared to the rotation mode shown in FIGS. 4A-4C. In particular, using the original rotation mode, there are 35 transitions. Using the DAR mode, there are 24 transitions. When the three pointers are at the same position, each of the elements have been used equally, and the cumulative contributed mismatch error is zero.

FIG. 6 shows an example of the reduction in transitions using the original rotation mode and the rotation mode with DAR. In particular, the numbers that are underlined are the numbers that toggled from a previous state, while the numbers shown in black remained the same as the previous state. As shown in FIG. 6, the DAR mode significantly reduces the switching activity of DAC cells. This is significant because each time a DAC cell is switched in or out of the signal path, charge injection occurs. Thus, reducing the switching activity reduces intersignal interference.

As shown in FIG. 6, an eight element array is used (such as the DEMs of FIGS. 4A-4C and 5A-5C). When a +2 signal is received in the first row, both the DEM with DAR and the DEM without DAR switch two elements (elements one and two) to 1's. When the +4 signal is received in the second row, the DEM with DAR switches two elements (elements three and four), such that elements one, two, three, and four are all 1's. In contrast, in the DEM without DAR, six elements are switched (elements one, two, three, four, five, and six), such that elements two and three are switched back to zeros and elements four, five, six, and seven are switched to ones. In the third row, a +3 signal is received, and the DAR with DEM switches three elements (elements one, two, and five), such that elements one and two are switched back to zeros and element five is switched to a 1. In the DEM without DAR, seven elements are switched (elements zero, one, three, four, five, six, and seven) such that elements zero, one, and seven are 1's and elements three, four, five, and six are zeros.

In general, there is a 1.5 dB THD improvement due to less switch based charge injection. Reduced charge injection shows up in the form of reduced harmonics and slightly lower noise floor since less energy is being distributed by the DEM.

| Mode | DC offset (uVrms) | SNR (A-wt dB) | THD −2 dBfs (dB) |
|---|---|---|---|
| normal | 38.62 | 112.75 | −93.09 |
| DAR | 34.84 | 112.62 | −94.62 |

According to various implementations, some advantages of the systems and method disclosed herein include, as shown in Monte Carlo Simulations, the disclosed DEM is more efficient with mismatch shaping for low amplitude signals. On average, the disclosed DEM outperforms the existing rotational DEM for 3 level DACs. The disclosed DEM results in improvements of by 5 or 6 dBs in DACs.

The disclosed DEM results in improvements of 3 dBs in CT Delta sigma ADCs. The disclosed DEM exhibits 30% less variation compared to traditional DEM in DACs. Additionally, the systems and method presented herein result in much better improvements (99% less variation) in ADCs. Another advantage of the systems and method disclosed herein is that smaller DAC cells can be used with this DEM for the same SNR/DNR targets, thus allowing more area efficient designs. Furthermore, the DEM reduced activity disclosed herein improves THD+N for higher amplitudes, due, at least in part, to reduction of ISI.

Figure 7:
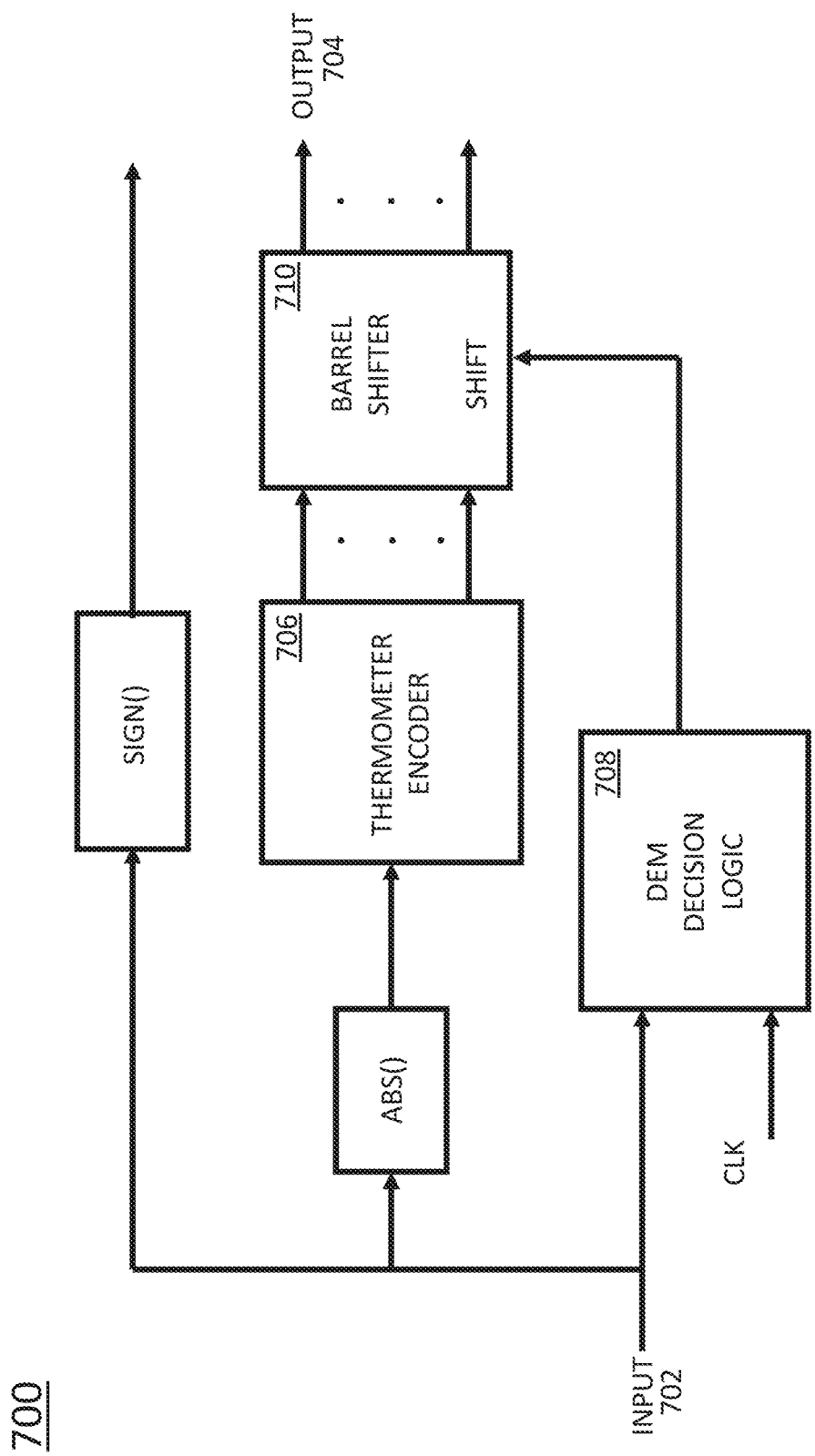
FIG. 7 is a diagram showing a three-level rotational DEM architecture including a barrel shifter having multiple pointers, according to various embodiments of the disclosure.

FIG. 7 is a diagram showing a three-level rotational DEM architecture 700 including a barrel shifter having multiple pointers, according to various embodiments of the disclosure. In various implementations, the three-level rotational DEM 700 can be used for shuffling signed thermometer data. In some examples, the three-level rotational DEM 700 is in a multi-bit three-level sigma-delta DAC. The input 702 is signed binary data, which is encoded at a thermometer encoder 706. The signed binary data input 702 is also input to DEM decision logic 708. The DEM decision logic 708 decides the start of the group of elements to be used as output. In particular, the DEM decision logic 708 outputs the positive and negative current pointer values to the barrel shifter 710. The barrel shifter 710 is a three-level rotational DEM, such as the three-level rotational DEM described above with respect to FIGS. 3 and 4A-4C and/or FIGS. 5A-5C. In various examples, the barrel shifter 710 shifts both positive and negative data. The output from the barrel shifter 710 is signed, shuffled, thermometer outputs.

Variations and Implementations

Figure 8:
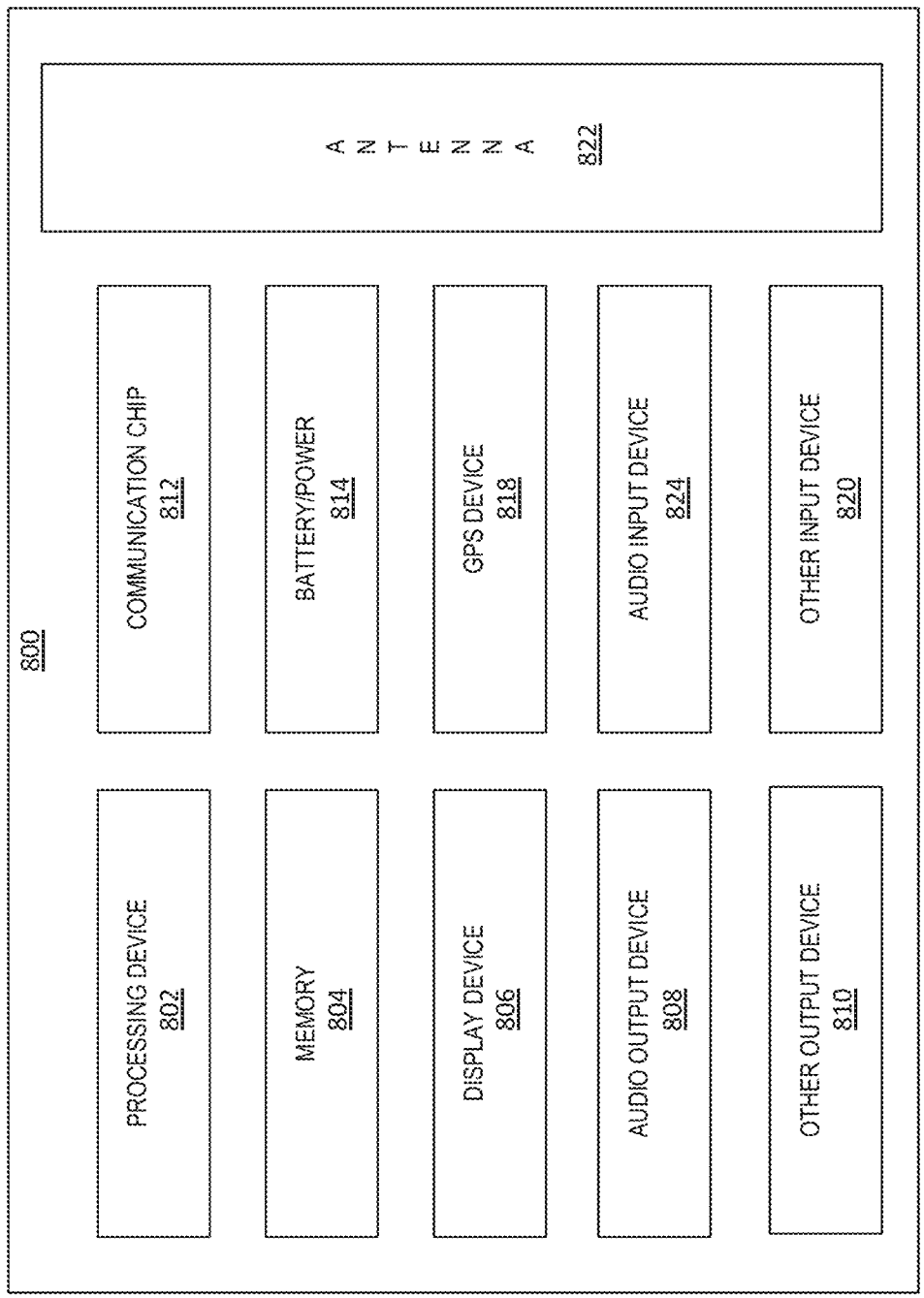
FIG. 8 is a block diagram of an example electrical device 800 that may include one or more class D drivers, in accordance with any of the embodiments disclosed herein.

FIG. 8 is a block diagram of an example electrical device 800 that may include one or more class D drivers, in accordance with any of the embodiments disclosed herein. A number of components are illustrated in FIG. 8 as included in the electrical device 800, but any one or more of these components may be omitted or duplicated, as suitable for the application. In some embodiments, some or all of the components included in the electrical device 800 may be attached to one or more motherboards. In some embodiments, some or all of these components are fabricated onto a single system-on-a-chip (SoC) die.

Additionally, in various embodiments, the electrical device 800 may not include one or more of the components illustrated in FIG. 8, but the electrical device 800 may include interface circuitry for coupling to the one or more components. For example, the electrical device 800 may not include a display device 806, but may include display device interface circuitry (e.g., a connector and driver circuitry) to which a display device 806 may be coupled. In another set of examples, the electrical device 800 may not include an audio input device 824 or an audio output device 808, but may include audio input or output device interface circuitry (e.g., connectors and supporting circuitry) to which an audio input device 824 or audio output device 808 may be coupled.

The electrical device 800 may include a processing device 802 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 802 may include one or more digital signal processors (DSPs), application-specific integrated circuits (ASICs), central processing units (CPUs), graphics processing units (GPUs), cryptoprocessors (specialized processors that execute cryptographic algorithms within hardware), server processors, or any other suitable processing devices. The electrical device 800 may include a memory 804, which may itself include one or more memory devices such as volatile memory (e.g., dynamic random access memory (DRAM)), nonvolatile memory (e.g., read-only memory (ROM)), flash memory, solid state memory, and/or a hard drive. In some embodiments, the memory 804 may include memory that shares a die with the processing device 802. This memory may be used as cache memory and may include embedded dynamic random access memory (eDRAM) or spin transfer torque magnetic random access memory (STT-M RAM).

In some embodiments, the electrical device 800 may include a communication chip 812 (e.g., one or more communication chips). For example, the communication chip 812 may be configured for managing wireless communications for the transfer of data to and from the electrical device 800. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 812 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 812 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 812 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 812 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 812 may operate in accordance with other wireless protocols in other embodiments. The electrical device 800 may include an antenna 822 to facilitate wireless communications and/or to receive other wireless communications (such as AM or FM radio transmissions).

In some embodiments, the communication chip 812 may manage wired communications, such as electrical, optical, or any other suitable communication protocols (e.g., the Ethernet). As noted above, the communication chip 812 may include multiple communication chips. For instance, a first communication chip 812 may be dedicated to shorter-range wireless communications such as Wi-Fi or Bluetooth, and a second communication chip 812 may be dedicated to longer-range wireless communications such as global positioning system (GPS), EDGE, GPRS, CDMA, WiMAX, LTE, EV-DO, or others. In some embodiments, a first communication chip 812 may be dedicated to wireless communications, and a second communication chip 812 may be dedicated to wired communications.

The electrical device 800 may include battery/power circuitry 814. The battery/power circuitry 814 may include one or more energy storage devices (e.g., batteries or capacitors) and/or circuitry for coupling components of the electrical device 800 to an energy source separate from the electrical device 800 (e.g., AC line power).

The electrical device 800 may include a display device 806 (or corresponding interface circuitry, as discussed above). The display device 806 may include any visual indicators, such as a heads-up display, a computer monitor, a projector, a touchscreen display, a liquid crystal display (LCD), a light-emitting diode display, or a flat panel display.

The electrical device 800 may include an audio output device 808 (or corresponding interface circuitry, as discussed above). The audio output device 808 may include any device that generates an audible indicator, such as speakers, headsets, or earbuds.

The electrical device 800 may include an audio input device 824 (or corresponding interface circuitry, as discussed above). The audio input device 824 may include any device that generates a signal representative of a sound, such as microphones, microphone arrays, or digital instruments (e.g., instruments having a musical instrument digital interface (MIDI) output).

The electrical device 800 may include a GPS device 810 (or corresponding interface circuitry, as discussed above). The GPS device 810 may be in communication with a satellite-based system and may receive a location of the electrical device 800, as known in the art.

The electrical device 800 may include another output device 810 (or corresponding interface circuitry, as discussed above). Examples of the other output device 810 may include an audio codec, a video codec, a printer, a wired or wireless transmitter for providing information to other devices, or an additional storage device.

The electrical device 800 may include another input device 820 (or corresponding interface circuitry, as discussed above). Examples of the other input device 820 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The electrical device 800 may have any desired form factor, such as a handheld or mobile electrical device (e.g., a cell phone, a smart phone, a mobile internet device, a music player, a tablet computer, a laptop computer, a netbook computer, an ultrabook computer, a personal digital assistant (PDA), an ultra mobile personal computer, etc.), a desktop electrical device, a server device or other networked computing component, a printer, a scanner, a monitor, a set-top box, an entertainment control unit, a vehicle control unit, a digital camera, a digital video recorder, or a wearable electrical device. In some embodiments, the electrical device 800 may be any other electronic device that processes data.

SELECT EXAMPLES

Example 1 provides a system for rotational dynamic element matching in a delta sigma converter, comprising a rotational dynamic element matching (DEM) component configured to receive a data signal, wherein the rotational DEM component has a plurality of elements, a start pointer, and a current pointer, wherein the current pointer shifts in a first direction when the data signal is positive and wherein the current pointer shifts in an opposite direction when the data signal is negative.

Example 2 provides a system according to any of the preceding and/or following examples, wherein the rotational DEM component is a barrel shifter, and wherein the current pointer shifts circularly.

Example 3 provides a system according to any of the preceding and/or following examples, wherein the first direction is clockwise and the opposite direction is counter-clockwise.

Example 4 provides a system according to any of the preceding and/or following examples, wherein the first direction is counterclockwise and the opposite direction is clockwise.

Example 5 provides a system according to any of the preceding and/or following examples, wherein a last element used when the data signal is positive is a first element used when the data signal is negative.

Example 6 provides a system according to any of the preceding and/or following examples, wherein a last element used when the data signal is negative is a first element used when the data signal is positive.

Example 7 provides a system according to any of the preceding and/or following examples, further comprising a current digital to analog converter configured to convert a rotational DEM component output into an analog signal.

Example 8 provides a system according to any of the preceding and/or following examples, wherein the current digital to analog converter is one of a 2-level current mode digital to analog converter and a 3-level current mode digital to analog converter.

Example 9 provides a system according to any of the preceding and/or following examples, wherein the current digital to analog converter is one of a 2-level voltage mode digital to analog converter and a 3-level voltage mode digital to analog converter.

Example 10 provides a system according to any of the preceding and/or following examples, wherein the current digital to analog converter is one of a 2-level charge mode digital to analog converter and a 3-level charge mode digital to analog converter.

Example 11 provides a system according to any of the preceding and/or following examples, wherein the data signal includes a sign indicator, wherein the sign indicator indicates whether the data signal is positive or negative.

Example 12 provides a system according to any of the preceding and/or following examples, wherein the current pointer is a first current pointer and further comprising a second current pointer wherein the first current pointer points at a first element from the plurality of elements and the second current pointer points at a second element from the plurality of elements and the first element is higher than the second element, and wherein when the data signal is positive, the second current pointer is shifted up and when the data signal is negative, the first current pointer is shifted down.

Example 13 provides a system according to any of the preceding and/or following examples, wherein the current pointer is a first current pointer and further comprising a second current pointer, wherein the first current pointer points at a first element from the plurality of elements and the second current pointer points at a second element from the plurality of elements, wherein the first and second current pointers shift in the first direction when the data signal is positive, and wherein the first and second current pointers shift in the opposite direction when the data signal is negative.

Example 14 provides a system according to any of the preceding and/or following examples, wherein the first element is higher than the second element and wherein when the data signal is positive, the second current pointer is moved in the first direction, and when the data signal is negative, the first pointer is moved in the opposite direction.

Example 15 provides a system for converting digital signals into analog signals using sigma-delta modulation, comprising a rotational dynamic element matching (DEM) component configured to receive a data signal, wherein the rotational DEM component has a plurality of elements, a start pointer, and a current pointer; and a current digital-to-analog converter configured to convert a rotational DEM component output into an analog signal.

Example 16 provides a system according to any of the preceding and/or following examples, wherein the current pointer shifts in a first direction when the data signal is positive and wherein the current pointer shifts in an opposite direction when the data signal is negative.

Example 17 provides a system according to any of the preceding and/or following examples, wherein the current DAC is one of a 2-level current DAC and a 3-level current DAC.

Example 18 provides a system according to any of the preceding and/or following examples, wherein the current DAC is one of a continuous time DAC and a discrete time DAC.

Example 19 provides a system according to any of the preceding and/or following examples, wherein the rotational DEM component is configured to randomly reseed the start pointer and the current pointer.

Example 20 provides a system according to any of the preceding and/or following examples, wherein the rotational dynamic element matching module includes three pointers.

Example 21 provides a method for dynamic element matching in a delta sigma converter, comprising receiving a data signal at a rotational dynamic element matching component having a plurality of elements, a start pointer, and a current pointer, shifting the current pointer in a first direction when the data signal is positive; and shifting the current pointer in an opposite direction when the data signal is negative.

Example 22 provides a method according to any of the preceding and/or following examples, wherein shifting the current pointer comprises shifting the current pointer circularly, and wherein the first direction is one of clockwise and counterclockwise.

Example 23 provides a system according to any of the preceding and/or following examples, wherein the pointers are randomly reseated.

Example 24 provides a system according to any of the preceding and/or following examples, wherein the pointers are DC stepped.

Example 25 provides a system according to any of the preceding and/or following examples, further comprising a continuous time DAC.

Example 26 provides a system according to any of the preceding and/or following examples, further comprising a discrete time DAC.

Example 27 provides a system according to any of the preceding and/or following examples, further comprising an analog-to-digital converter.

Example 28 includes a system or an apparatus that includes a converter as discussed or depicted in any of examples 1-27, some other example, or as otherwise discussed or depicted herein.

Example 29 includes an apparatus comprising means to implement a converter as discussed or depicted in any of examples 1-27, some other example, or as otherwise discussed or depicted herein.

Example 30 includes a method for implementing or manufacturing a converter as discussed or depicted in any of examples 1-27, some other example, or as otherwise discussed or depicted herein.

Example 31 includes one or more non-transitory computer-readable media comprising instructions that, upon execution of the instructions by an electronic device, are to cause the electronic device to implement or manufacture a converter as discussed or depicted in any of examples 1-27, some other example, or as otherwise discussed or depicted herein.

In the preceding discussion, reference may be made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the preceding detailed description is not to be taken in a limiting sense.

For the purposes of the present disclosure, the phrase "A or B" means (A), (B), or (A and B). For the purposes of the present disclosure, the phrase "A, B, or C" means (A), (B), (C), (A and B), (A and C), (B and C), or (A, B and C).

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or elements are in direct contact.

Various operations may be described as multiple discrete operations in turn, in a manner that is most helpful in understanding the claimed subject matter. However, the order of description should not be construed as to imply that these operations are necessarily order dependent.

As used herein, the term "module" may refer to, be part of, or include an application specific integrated circuit (ASIC), an electronic circuit, a processor (shared, dedicated, or group) or memory (shared, dedicated, or group) that execute one or more software or firmware programs, a combinational logic circuit, or other suitable components that provide the described functionality.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated embodiments, including what is described in the Abstract, is not intended to be exhaustive or limiting as to the precise forms disclosed. While specific implementations of, and examples for, various embodiments or concepts are described herein for illustrative purposes, various equivalent modifications may be possible, as those skilled in the relevant art will recognize. These modifications may be made in light of the above detailed description, the Abstract, the Figures, or the claims.

What is claimed is:

1. A system for rotational dynamic element matching in a delta sigma converter, comprising:
    a rotational dynamic element matching (DEM) component configured to receive a data signal, wherein the rotational DEM component has a plurality of elements included in a barrel shifter, a start pointer, and a current pointer, wherein the start pointer and the current pointer point to elements in the same barrel shifter;
    wherein the current pointer shifts in a first direction when the data signal is positive and wherein the current pointer shifts in an opposite direction when the data signal is negative; and
    wherein the start pointer is jumped by a fixed value when the current pointer and the start pointer are equal and point to the same DEM element.

2. The system of claim 1, wherein the rotational DEM component is a barrel shifter, and wherein the current pointer shifts circularly.

3. The system of claim 2, wherein the first direction is clockwise and the opposite direction is counterclockwise.

4. The system of claim 2, wherein the first direction is counterclockwise and the opposite direction is clockwise.

5. The system of claim 1, wherein a last element used when the data signal is positive is a first element used when the data signal is negative.

6. The system of claim 1, wherein a last element used when the data signal is negative is a first element used when the data signal is positive.

7. The system of claim 1, further comprising a current digital to analog converter configured to convert a rotational DEM component output into an analog signal.

8. The system of claim 7, wherein the current digital to analog converter is one of a 2-level current mode digital to analog converter and a 3-level current mode digital to analog converter.

9. The system of claim 7, wherein the current digital to analog converter is one of a 2-level voltage mode digital to analog converter and a 3-level voltage mode digital to analog converter.

10. The system of claim 7, wherein the current digital to analog converter is one of a 2-level charge mode digital to analog converter and a 3-level charge mode digital to analog converter.

11. The system of claim 1, wherein the data signal includes a sign indicator, wherein the sign indicator indicates whether the data signal is positive or negative.

12. The system of claim 1, wherein the current pointer is a first current pointer and further comprising a second current pointer,
    wherein the first current pointer points at a first element from the plurality of elements of the barrel shifter, and the second current pointer points at a second element from the plurality of elements of the same barrel shifter;
    wherein the first and second current pointers shift in the first direction when the data signal is positive, and
    wherein the first and second current pointers shift in the opposite direction when the data signal is negative.

13. The system of claim 12, wherein the first element is higher than the second element and wherein
    when the data signal is positive, the second current pointer is configured to move in the first direction, wherein the first direction is counterclockwise, and
    when the data signal is negative, the first pointer is configured to move in the opposite direction, wherein the opposite direction is clockwise.

14. A system for converting digital signals into analog signals using sigma-delta modulation, comprising:
    a rotational dynamic element matching (DEM) component configured to receive a data signal, wherein the rotational DEM component has a plurality of elements included in a barrel shifter, a start pointer, and a current pointer, wherein the start pointer and the current pointer point to elements in the same barrel shifter; and
    a current digital-to-analog converter configured to convert a rotational DEM component output into an analog signal.

15. The system of claim 14, wherein the current pointer shifts in a first direction when the data signal is positive and wherein the current pointer shifts in an opposite direction when the data signal is negative.

16. The system of claim 14, wherein the current DAC is one of a 2-level current DAC and a 3-level current DAC.

17. The system of claim 14, wherein the current DAC is one of a continuous time DAC and a discrete time DAC.

18. The system of claim 14, wherein rotational DEM component is configured to randomly reset the start pointer and the current pointer.

19. A method for dynamic element matching in a delta sigma converter, comprising:
    receiving a data signal at a rotational dynamic element matching component having a plurality of elements included in a barrel shifter, a start pointer, and a current pointer, wherein the start pointer and the current pointer point to elements in the same barrel shifter;
    shifting the current pointer in a first direction when the data signal is positive;
    shifting the current pointer in an opposite direction when the data signal is negative; and
    jumping the start pointer by a fixed value when the current pointer and the start pointer are equal and point to the same element in the barrel shifter.

20. The method of claim 19, wherein shifting the current pointer comprises shifting the current pointer circularly, and wherein the first direction is one of clockwise and counterclockwise.

* * * * *